(12) United States Patent
Kawamoto

(10) Patent No.: US 9,916,663 B2
(45) Date of Patent: Mar. 13, 2018

(54) IMAGE PROCESSING METHOD AND PROCESS SIMULATION APPARATUS

(71) Applicant: Toshiba Memory Corporation, Tokyo (JP)

(72) Inventor: Akiko Kawamoto, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/233,916

(22) Filed: Aug. 10, 2016

(65) Prior Publication Data

US 2017/0213346 A1   Jul. 27, 2017

(30) Foreign Application Priority Data

Jan. 27, 2016 (JP) .................. 2016-013623

(51) Int. Cl.
*G06T 7/00* (2017.01)
*G06F 17/50* (2006.01)
*G06T 5/00* (2006.01)

(52) U.S. Cl.
CPC ........ *G06T 7/0085* (2013.01); *G06F 17/5009* (2013.01); *G06T 5/002* (2013.01); *G06T 7/0004* (2013.01); *G06T 7/0081* (2013.01); *G06T 2207/10056* (2013.01); *G06T 2207/20061* (2013.01); *G06T 2207/30148* (2013.01)

(58) Field of Classification Search
CPC ..... G06T 7/0085; G06T 5/002; G06T 7/0004; G06T 7/0081; G06F 17/5009
See application file for complete search history.

(56) References Cited

U.S. PATENT DOCUMENTS

| 6,300,955 B1* | 10/2001 | Zamir | G06T 7/12 345/563 |
|---|---|---|---|
| 8,077,962 B2 | 12/2011 | Toyoda et al. | |
| 2002/0164074 A1* | 11/2002 | Matsugu | G06T 9/008 382/166 |
| 2004/0042648 A1* | 3/2004 | Yoshidda | G06T 7/74 382/151 |
| 2004/0263514 A1* | 12/2004 | Jin | G06K 9/0063 345/440 |
| 2006/0110042 A1* | 5/2006 | Onishi | G06K 9/6211 382/199 |

(Continued)

FOREIGN PATENT DOCUMENTS

JP   2014058008 A   4/2014

*Primary Examiner* — David F Dunphy
(74) *Attorney, Agent, or Firm* — Patterson & Sheridan, LLP

(57) ABSTRACT

An image processing method includes the steps of detecting edge information from an input image, identifying a plurality of lines from the edge information, dividing the input image into a plurality of areas based on the relative locations of the plurality of identified lines, calculating a similarity between adjacent areas of the plurality of divided areas, detecting boundaries between the adjacent areas as line segments partitioning the adjacent areas based on a degree of dissimilarity of the adjacent areas, wherein each of the line segments is at least a portion of the plurality of lines, and connecting the line segments forming the boundaries, and generating a connected shape using the boundaries.

18 Claims, 8 Drawing Sheets

(56) References Cited

U.S. PATENT DOCUMENTS

| | | | |
|---|---|---|---|
| 2007/0023653 A1* | 2/2007 | Toyoda | G06T 7/0006 250/310 |
| 2008/0250384 A1* | 10/2008 | Duffy | G03F 7/70525 716/55 |
| 2009/0316988 A1* | 12/2009 | Xu | G06K 9/6256 382/173 |
| 2010/0008576 A1* | 1/2010 | Piramuthu | G06K 9/342 382/173 |
| 2010/0183225 A1* | 7/2010 | Vantaram | G06T 7/11 382/173 |
| 2011/0075927 A1* | 3/2011 | Xu | G06K 9/6224 382/173 |
| 2012/0098952 A1* | 4/2012 | Nakahira | G01N 23/2251 348/79 |
| 2012/0275701 A1* | 11/2012 | Park | G06K 9/4671 382/173 |
| 2013/0188859 A1* | 7/2013 | Luo | G06T 7/0002 382/149 |
| 2013/0216141 A1* | 8/2013 | Ushiba | G01B 15/00 382/218 |
| 2014/0314312 A1* | 10/2014 | Hashiguchi | G06T 7/0081 382/164 |
| 2015/0228063 A1 | 8/2015 | Minakawa et al. | |
| 2015/0243018 A1* | 8/2015 | Vajaria | G06T 7/0004 382/133 |
| 2016/0300338 A1* | 10/2016 | Zafar | G06T 7/001 |

* cited by examiner

IMAGE PROCESSING METHOD AND PROCESS SIMULATION APPARATUS

CROSS-REFERENCE TO RELATED APPLICATION

This application is based upon and claims the benefit of priority from Japanese Patent Application No. 2016-013623, filed Jan. 27, 2016, the entire contents of which are incorporated herein by reference.

FIELD

Embodiments described herein relate generally to an image processing method, and a process simulation apparatus.

BACKGROUND

In a simulation of a semiconductor process, data based on an image of a physical structure which is obtained by a scanning electron microscope (SEM), a transmission electron microscope (TEM) or a scanning transmission electron microscope (STEM) is used as input data. When a shape is extracted from the image obtained by the electron microscope as the input data of the simulation, there are the following issues.

First, tuning of image processing parameters for edge detection and smoothing is not easily performed since various factors complexly influence the tuning, and when performing the simulation, it often takes time and effort to tune the parameters. Also, noise is often included in edge information which is detected from the image data, and more accurate simulation is desired. Furthermore, if a concave or convex shape is present in the detected edge information, calculation time of the shape simulation increases.

DETAILED DESCRIPTION

Embodiments described herein provide an image processing method and a process simulation apparatus that are capable of generating an input shape for simulation with little noise.

In general, according to one embodiment, an image processing method includes detecting edge information from an input image, identifying a plurality of lines from the edge information, dividing the input image into a plurality of areas based on relative locations of the plurality of identified lines, calculating a similarity between the adjacent areas of the plurality of divided areas, detecting boundaries between adjacent areas of the divided areas as line segments partitioning the adjacent areas based on a degree of dissimilarity of the adjacent areas, wherein each of the line segments is at least a portion of the plurality of lines, and connecting the line segments forming the boundaries and generating a connected shape using the boundaries.

Hereinafter, embodiments will be described with reference to the drawings. The embodiments described herein do not limit the embodiments.

An image processing method according to the embodiment identifies a plurality of lines from an edge detection result, calculates similarities between respective divided areas that are adjacent to each other in an input image which is divided by using the lines as boundaries, and determines whether or not a line segment partitioning the adjacent areas is a boundary partitioning areas having different physical properties, thereby enabling detection of an edge shape in the input image. A more detailed description thereof is as follows.

Figure 1:
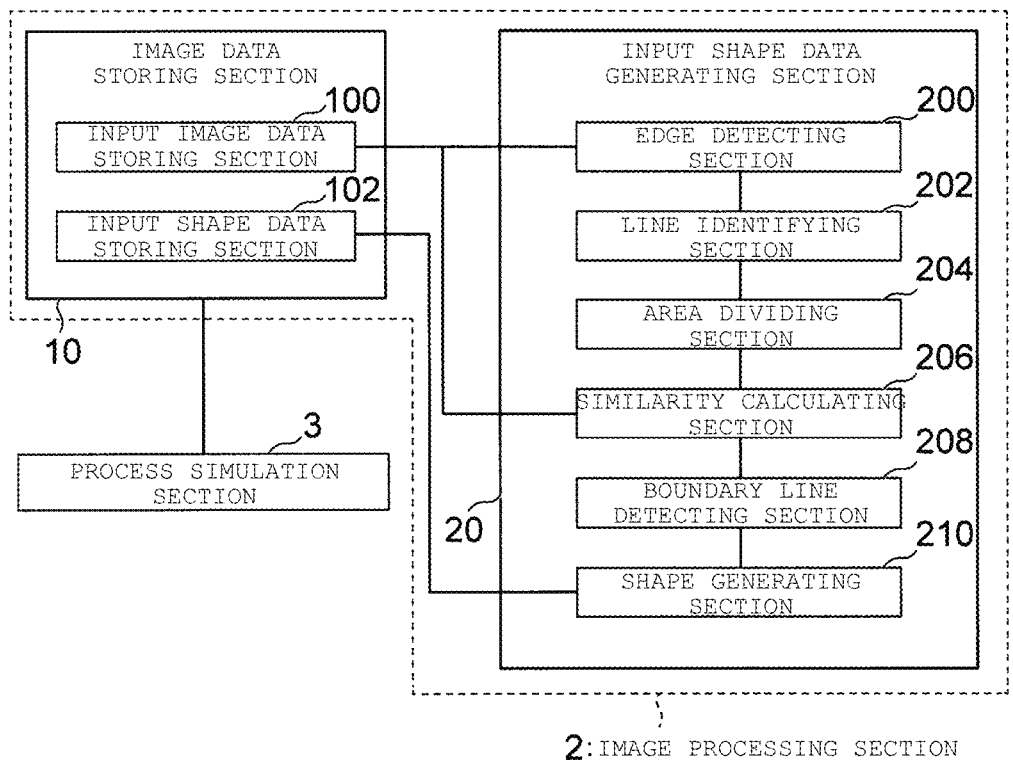
FIG. 1 is a block diagram of a process simulation apparatus according to an embodiment.

FIG. 1 is a block diagram of a process simulation apparatus 1 according to the embodiment. The process simulation apparatus 1 performs the simulation of a semiconductor manufacturing process, and includes an image processing section 2, and a process simulation section 3.

The image processing section 2 performs image processing, and includes an image data storing section 10 and an input shape data generating section 20. Image data is input to the image processing section 2. The image processing section 2 generates, from the input image data, input shape data that is the input data for the process simulation section 3. In addition to generating the input shape data, the image processing which is necessary during the execution of the process simulation may be performed by the image processing section, but these steps are omitted in FIG. 1. The process simulation section 3 performs the simulation of the semiconductor manufacturing process. Detailed description of the process simulation section 3 will be omitted.

The image data storing section 10 stores input/output image data, and includes an input image data storing section 100, and an input shape data storing section 102. The input image data storing section 100 stores the input image, and for example, includes a memory that stores the image data which is output from a SEM or a TEM as an input image. The input shape data storing section 102 stores the input shape of the simulation, and for example, includes a memory that stores shape data of the input image which is output by the image processing method according to the embodiment.

The input shape data generating section 20 generates the input shape data from the input image, and includes an edge detecting section 200, a line identifying section 202, an area dividing section 204, a similarity calculating section 206, a boundary detecting section 208, and a shape generating section 210. Each of the operation sections may be implemented by hardware, or may be executed as software by a computer with a program configured therefor.

The edge detecting section 200 receives the input image from the input image data storing section 100, detects edge information from the input image, and outputs the detected edge information. The edge information detected by the edge detecting section 200 may be gray scale data or binary data. The edge information may be selected depending on the format of the input data for a line identifying method which is executed in the line identifying section 202.

The line identifying section 202 receives the edge information from the edge detecting section 200, identifies a plurality of lines from the edge information, and outputs information for the plurality of identified lines. Specifically, in a case where an edge is present on a line according to the edge information, the predetermined number of edges is detected in order.

The area dividing section 204 receives the information of the plurality of lines from the line identifying section 202, and divides an area of the input image data based on the information of the lines, i.e., the input image is divided into areas formed by the intersection of the lines. For example, in a case where information concerning two lines is input and the two lines cross each other, the input image is divided into up to four areas. In a case where information of three lines is input, the input image is divided into up to seven areas. That is, in a case where information of n lines is the input image is divided into up to 1+(1+ . . . +n) areas. For three lines, the maximum number of areas is thus 1+(1+2+3).

The similarity calculating section 206 calculates the degree of similarity, and thus the dissimilarity if present, between adjacent areas of the plurality of areas into which the input image data is divided by the area dividing section 204, using in this embodiment values which are calculated from gray scale values of the adjacent areas. Since the input image data is used in the calculation of the similarity, the similarity calculating section 206 may use the input image data which is stored in the input image data storing section 100.

The boundary detecting section 208 receives a calculation result of the similarity calculating section 206. In a case where the calculation result indicates that the adjacent areas are areas having physical properties which are different from each other, based on a difference in the gray scale images of the adjacent areas, the similarity calculating section 206 detects a line segment, from the line dividing the adjacent areas, as a boundary. For example, where two areas are areas having different physical properties, the two areas of interest in a captured image may be different substances.

The shape generating section 210 receives the boundary information which was detected by the boundary detecting section 208, generates a connected shape by connecting the line segments which were detected as boundaries, and stores the generated shape in the input shape data storing section 102. The connected shape is a shape that partitions the areas having the different physical properties in the input image, and is for example, a shape that partitions the input image into respective substances or materials.

Figure 2:
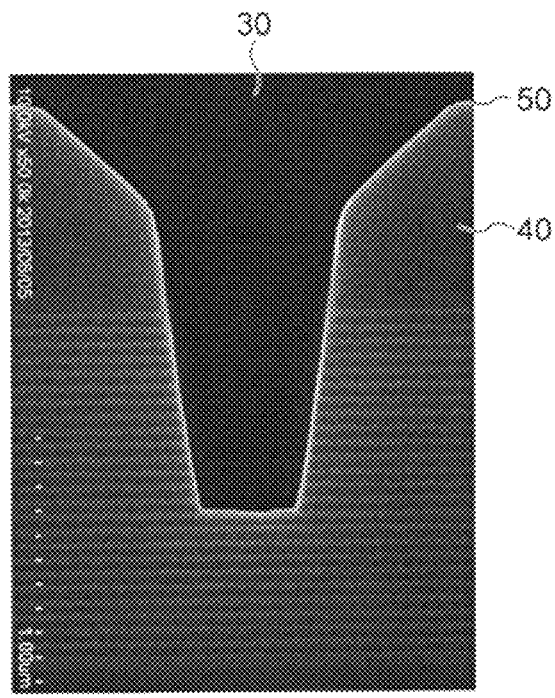
FIG. 2 is a diagram illustrating an example of an input image.

FIG. 2 is an image of an actual structure captured by the SEM which is the input of the simulation, and is an example of the input image of the embodiment. As illustrated in FIG. 2, the captured image includes a first area 30, and a second area 40. For example, the first area 30 and the second area 40 are substances having different physical properties or materials. The image processing method according to the embodiment detects a shape 50 which is a boundary between the two areas 30 and 40.

Figure 3:
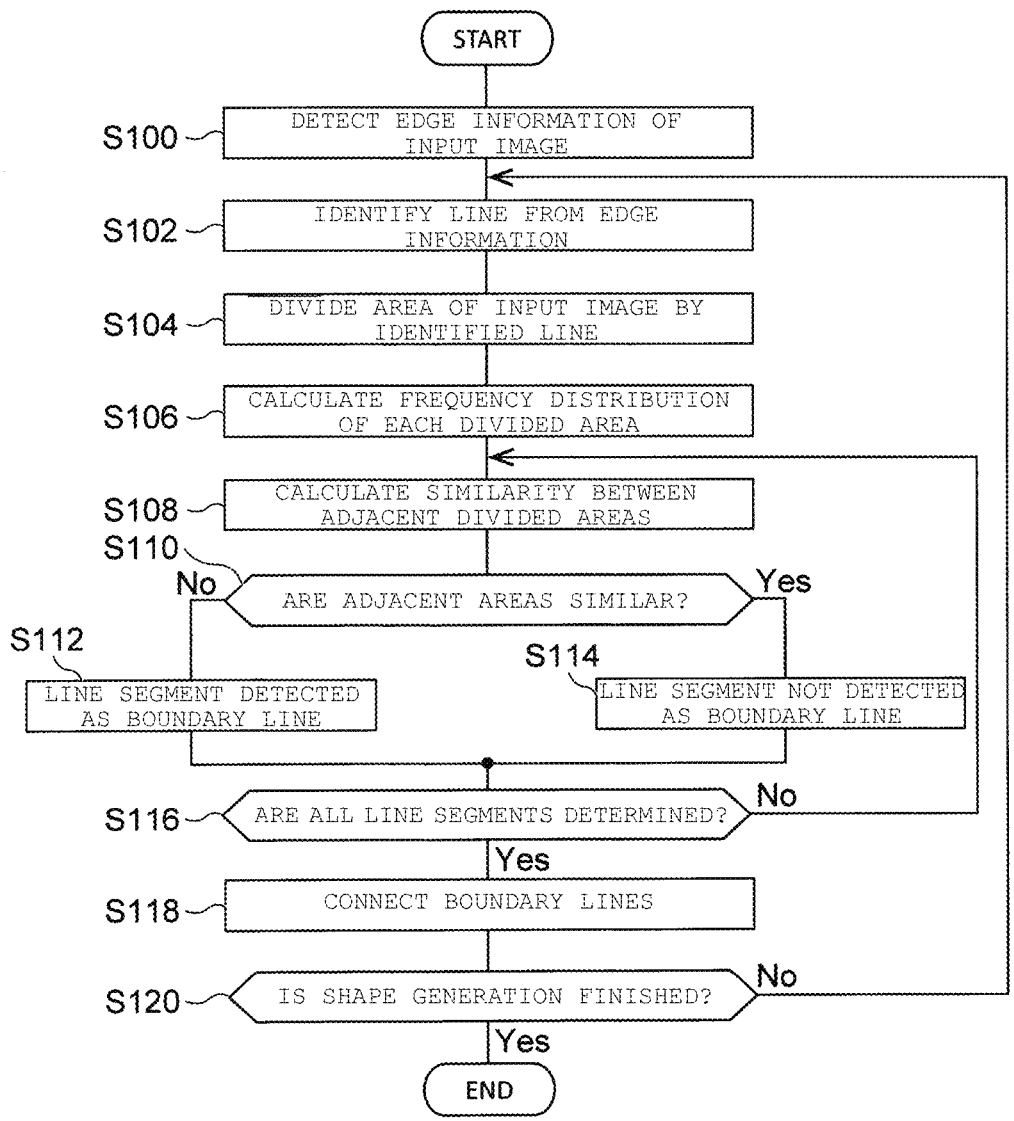
FIG. 3 is a flowchart of an image processing method according to an embodiment.

Next, operations of the image processing method according to the embodiment will be described. FIG. 3 is a flowchart illustrating a flow of the image processing method according to the embodiment. Hereinafter, each step will be described in detail with reference to the flowchart of FIG. 3 and other drawings.

Initially, the edge detecting section 200 detects the edge information from the input image illustrated in FIG. 2, by using the input image data which is stored in the input image data storing section 100 (step S100). For example, an edge detecting method, such as ones employing the Canny filter or the Laplacian filter, is used. Any method may be used so long as it can detect edge information from the image.

Figure 4:
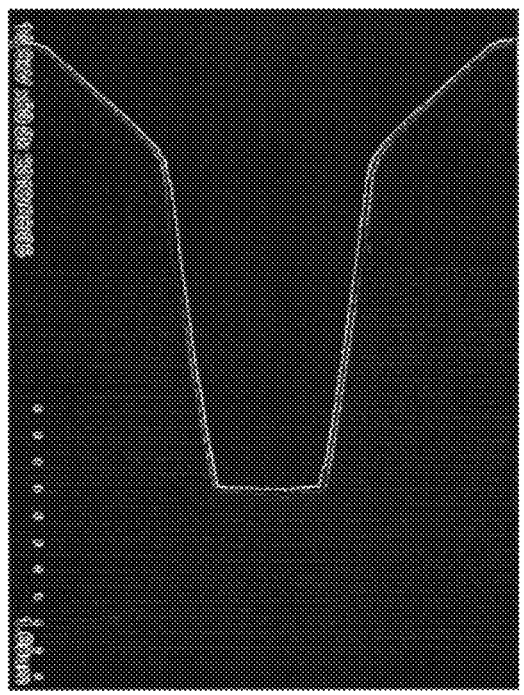
FIG. 4 is a diagram illustrating an example of an edge detected image of the input image.

FIG. 4 illustrates the edge information data which is obtained by applying the edge detection methodology to the input image illustrated in FIG. 2. As a result of the step S100, the edge detecting section 200 obtains the edge information illustrated in FIG. 4. That is, the step S100 detects the shape 50 illustrated in FIG. 2 as illustrated in FIG. 4. The processed edge information resulting from the step may include noise or discontinuous edges.

Next, the line identifying section 202 identifies the lines, in the case of the shape of FIG. 4, a plurality of lines, from the edge information as illustrated in FIG. 4 (step S102). For example, line course probabilities of edges constituting the edge information are calculated by the Hough transform or the like, and thereby, the plurality of lines comprising the edges are identified. In the following description, the image processing method using the Hough transform will be described. It is noted that the identifying method of the lines constituting the edges is not limited to the Hough transform. Any method which is capable of obtaining similar lines from the detected edge information may be used.

Figure 5A:
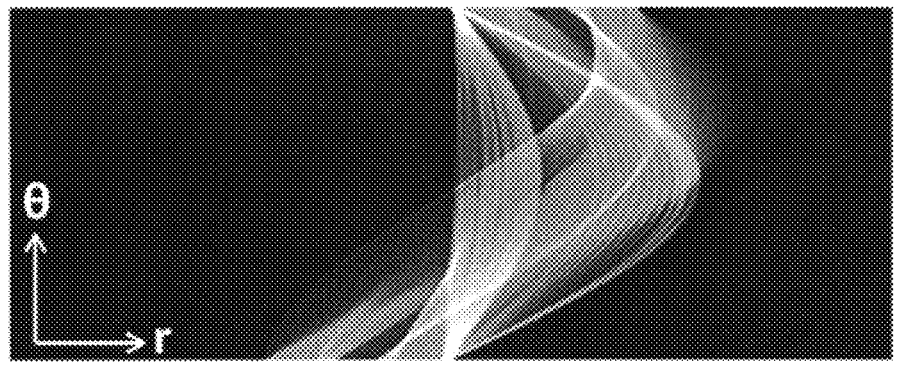
FIG. 5A and FIG. 5B are diagrams illustrating an example of a result which is obtained by performing the Hough transform of the edge detected image.

FIG. 5A illustrates a result which is obtained by performing the Hough transform of the edge information illustrated in FIG. 4 on the Hough space. As illustrated in FIG. 5A, luminance values on the Hough space are determined in accordance with lines passing through respective pixels of the edge information illustrated in FIG. 4. The Hough transform transforms a line on the physical space into one point (r, θ) in the polar coordinate system corresponding to a point on the line having the shortest distance to the origin point. In other words, a group of the lines passing through one point on the physical space is transformed so as to draw a sine wave on the Hough space. Since all pixels constituting a certain line in the physical space are transformed into a curve passing through this point (r, θ) on the Hough space, a luminance value thereof is large on the Hough space.

Accordingly, detecting points having large luminance values on the Hough space makes it possible to identify the lines on the physical space. From the reasons described above, FIG. 5B is a diagram which is obtained by detecting a point P1 to a point P5 of five points having large luminance values in the Hough space illustrated in FIG. 5A. The five points are selected as an example. It is noted that the number of identified lines may be changed appropriately.

Figure 5B:
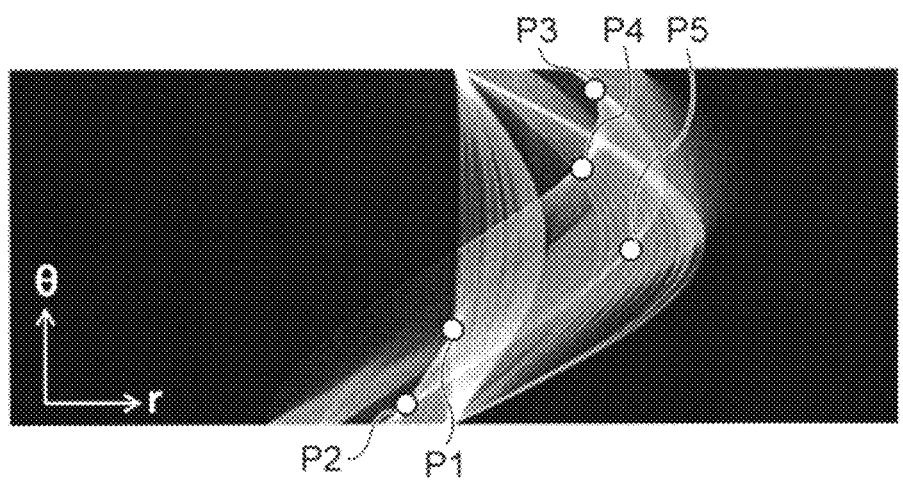
Figure 6:
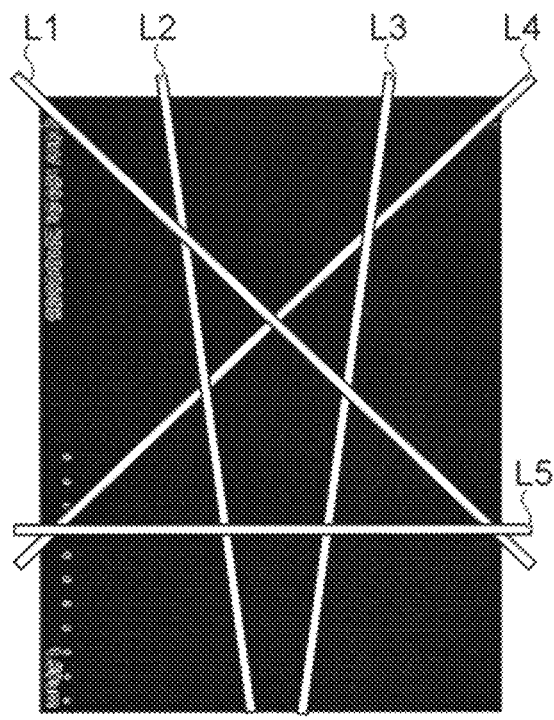
FIG. 6 is a diagram illustrating an example of a case where lines are identified from the edge detected image.

FIG. 6 is a diagram illustrating a case where the point P1 to the point P5 of the five points that are detected in FIG. 5B are inversely transformed into a line L1 to a line L5 on the physical space, and are superimposed on the image of the edge information illustrated in FIG. 4. That is, the point P1 on the Hough space is transformed into the line L1 on the physical space. Similarly, the point P2, the point P3, the point P4, and the point P5 on the Hough space are respectively transformed into the line L2, the line L3, the line L4, and the line L5 on the physical space. As illustrated in FIG. 6, the edge information which mainly forms the shape 50 of FIG. 2 is included in the lines L1 to L5.

Figure 7:
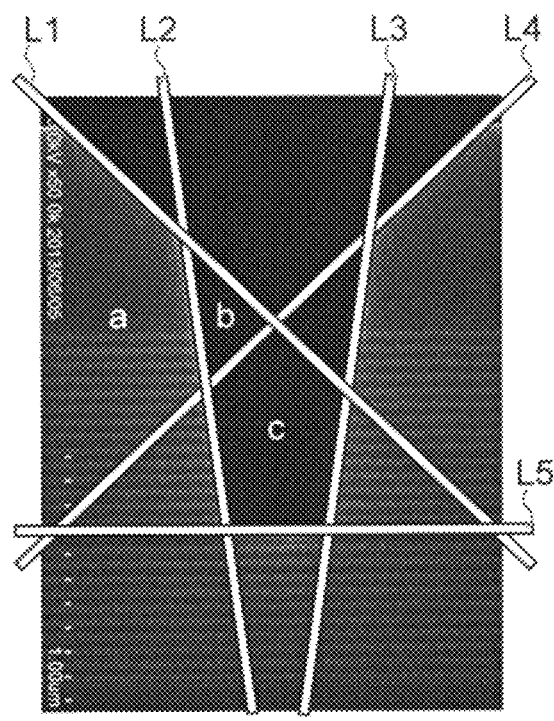
FIG. 7 is a diagram illustrating an example of a case where an area is divided by the identified lines.

Next, the area dividing section 204 divides an area of the input image data into a plurality of areas, using the identified lines including the edges (step S104). FIG. 7 is a diagram illustrating an example of a state where the input image is divided into the plurality of areas by the lines including the edges and identified by the line identifying section 202. For example, FIG. 7 illustrates the input image (SEM image) which is divided into 13 areas by the five lines of the lines L1 to L5.

Next, the similarity calculating section 206 calculates a frequency distribution of gradation values of each of the areas on the divided input image, in each of the areas on the input image which is divided by the area dividing section 204 (step S106). Comparing the frequency distributions of the gradation values, that is, the gray scale values of the respective areas, makes it possible to calculate the similarity or degree of similarity between adjacent areas. For example, for the frequency distributions of the gradation values which are targets of the comparison, the gradation value may be a density value of each pixel, a luminance value thereof, or one from which a gray scale value serving as another indicator can be obtained. Moreover, the pixels forming the edges may be included or may be excluded.

Figure 8A:
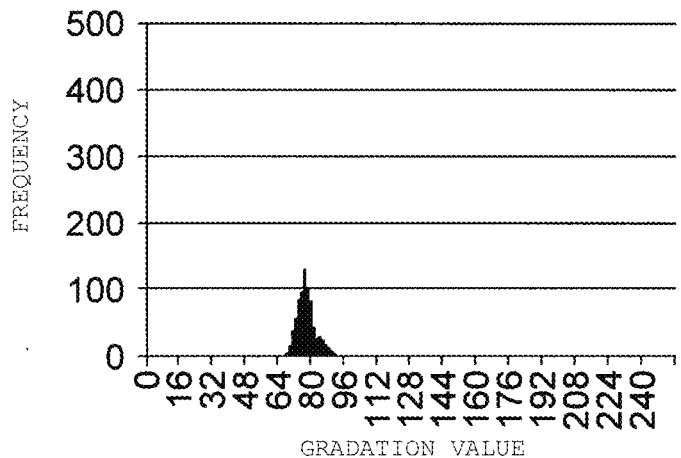
FIGS. 8A to 8C are diagrams illustrating frequency distributions of gradation values of portions of the areas obtained by the division.
Figure 8B:
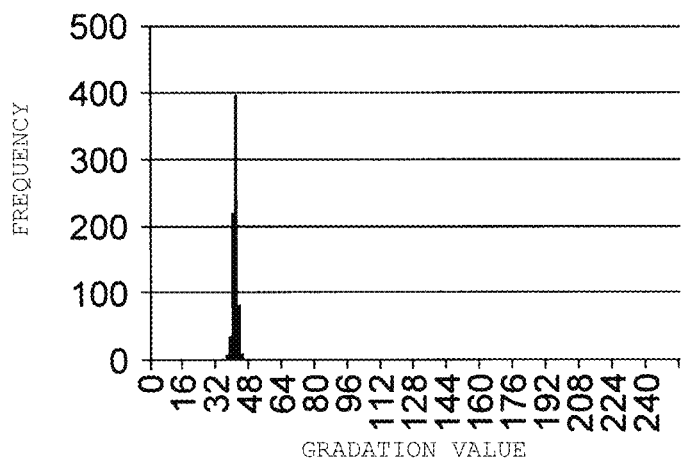
Figure 8C:
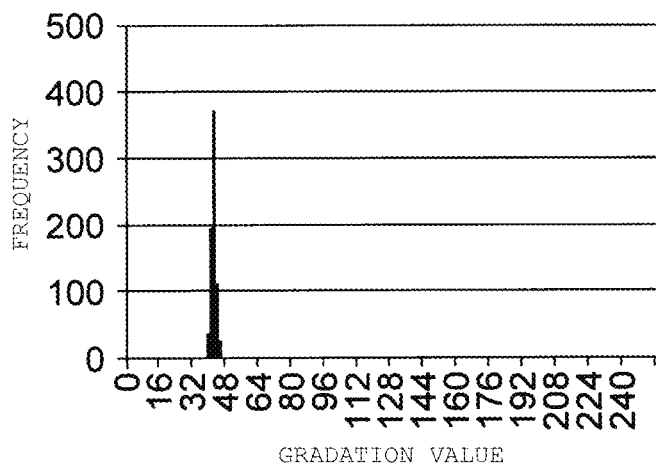

FIG. 8A to FIG. 8C respectively illustrate the frequency distributions of the gradation values of an area a, an area b, and an area c, among the respective areas illustrated in FIG. 7. The graphs are histograms in which a horizontal axis denotes the gradation value, and a vertical axis denotes the frequency, e.g., when the input image is a gray scale image having pixels of different intensity values, the histograms show frequency distributions of intensity. As illustrated in FIG. 8A, in the histogram of the gradation values of the area a, the average value is approximately 80, and the frequency, i.e., the number of pixels having that gradation value, is approximately 120 at the gradation value having the largest frequency of occurrence, and the histogram has a gentle mountain shape. Meanwhile, in the area b illustrated in FIG. 8B and the area c illustrated in FIG. 8C, the average value is approximately 36, and the frequency is slightly less than 400 at the gradation value having the largest frequency, and the histograms have a pulse shape of which the half value width is narrow.

Next, the similarity calculating section 206 calculates the similarity of adjacent areas among the plurality of divided areas, based on the frequency distributions illustrated in FIG. 8A to FIG. 8C (step S108). For example, the similarity between the area a and area b which are adjacent to each other is calculated from the two frequency distributions illustrated in FIG. 8A and FIG. 8B. A similarity calculating method, for example, may calculate a correlation value of the normal correlation as a similarity, calculate the similarity by simply comparing the respective average values, or calculate the similarity by another comparing method. In the example, the similarity between the area a and the area b is calculated to be small, i.e., they are dissimilar, and meanwhile, the similarity between the area b and the area c is calculated to be large, i.e., they are similar.

Next, the boundary detecting section 208 determines whether or not each of the line segments dividing the adjacent areas are areas having different contents, for example different physical properties based on the similarity of the gray scale values, different binary data, or other weighting factors for each area (step S110). For example, based on a predetermined threshold, the boundary detecting section 208 determines whether the similarity that is calculated by the similarity calculating section 206 is lower than the predetermined threshold or is the predetermined threshold or more. Thereby, the boundary detecting section 208 determines whether or not each of the line segments partitions areas having different physical properties based on the degree of dissimilarity of the areas on the opposite sides of the lines.

For example, since the calculated degree of similarity between the area a and the area b is small, the areas a and b are determined to be not similar (Step S110: No). As a result, the boundary detecting section 208 detects a line segment partitioning the area a and the area b as a boundary (step S112). On the other hand, since the calculated degree of similarity between the area b and the area c is large, the areas b and c are determined to be similar (Step S110: Yes). As a result, the boundary detecting section 208 does not detect a line segment partitioning the area b and the area c as a boundary (step S114).

The calculation of the degree of similarity between the adjacent divided areas is repeated until the similarities are calculated for all of the adjacent areas. The processing determines whether or not each line segment is a boundary between areas having different physical properties, for all line segments that are formed by points where the line L1 to the line L5 intersect with each other and the outermost pixels of the line L1 to the line L5 in the input image (step S116). In a case where the determination has not been made for all line segments (step S116: No), the processing is returned to the step S108, and the processing from the step S108 to the step S114 is repeated until the above determination is made for all line segments.

Figure 9:
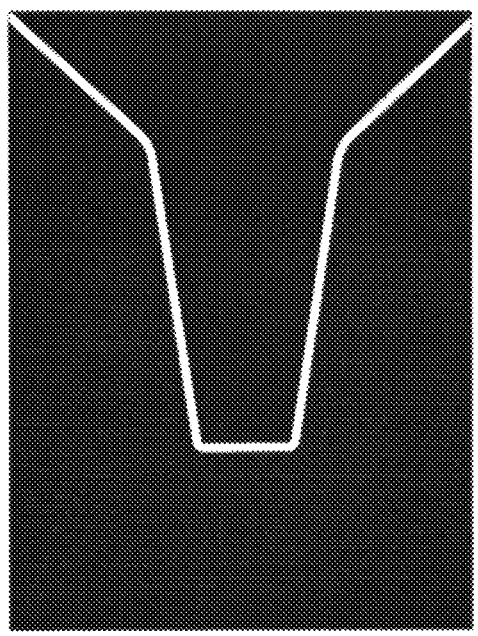
FIG. 9 is a diagram illustrating an example of an edge shape which is generated by the image processing method according to the embodiment.

Once the determination is made for all line segments (step S116: Yes), thereafter, the shape generating section 210 connects the line segments which are detected as boundaries, and generates a connected shape (step S118). FIG. 9 is a diagram illustrating the shape that is obtained by connecting the line segments which are detected as boundaries. As illustrated in FIG. 9, it is possible to obtain the shape that partitions the areas having different physical properties, from the SEM image being the input image. The shape generating section 210 stores the generated shape in the input shape data storing section 102.

As illustrated in FIG. 9, it is possible to connect the line segments into a smooth curve shape without sharp corners at the connections of the line segments which are detected as boundaries, and to generate the shape. For example, the corner between the line segments may be rounded by spline interpolation, or may be connected as a curve having a suitable curvature depending on an angle between the line segments or lengths of the line segments.

Next, the shape generating section 210 determines whether or not all shape generations are finished (step S120). In a case where the shape is generated by the shape generating section 210 (Step S120: Yes), the shape generating processing is finished. In a case where a problem arises such that the boundaries may not be properly connected (Step S120: No), it is possible to perform a loop processing using the line identifying process to detect the missing boundary. This branch may be omitted. In a case where the shape generating section 210 finishes the generation of the shape, the shape processing is finished.

Figure 10:
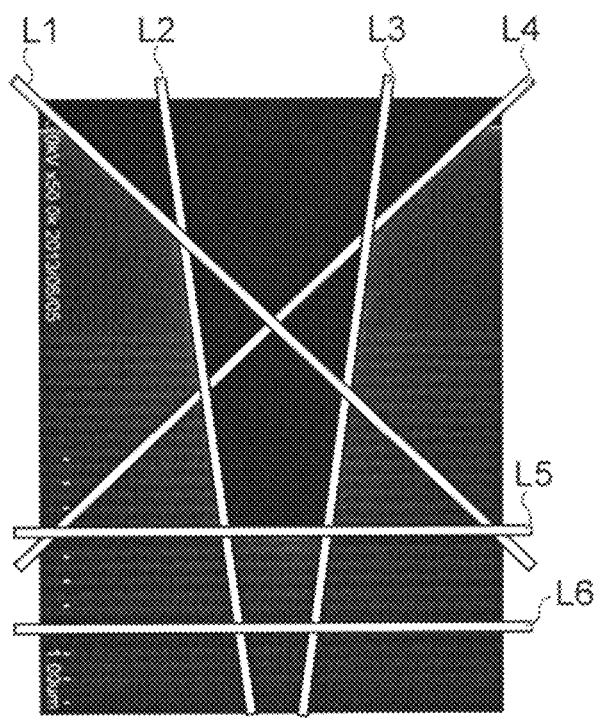
FIG. 10 is a diagram illustrating another example of line identification according to an embodiment.

For example, as illustrated in FIG. 10, in a case where a line L6 is detected in the step S102 but the physical properties on either side of the line are the same, none of the line segments constituting the line L6 are detected as a boundary partitioning areas having different physical properties. In such a case, points in the vicinity of points corresponding to the line L6 on the Hough space may be processed so as not to be detected. Then, another line may be newly detected, and the processing from the step S102 to the step S118 may be performed again. It is noted that the line identifying method is not limited to the Hough transform.

As described above, according to the image processing method of the embodiment, by identifying the line from the edge information including noise, and calculating the similarity between the adjacent areas in the input image which is divided by the lines, it is possible to obtain the input shape for the simulation with low noise in the resulting shape image. In the process simulation, a simulation result or the processing time to obtain the result is greatly changed due to an unintended convex and concave shape in the edge information or noise in the vicinity of the edges. By the image processing method according to the embodiment, the impact of these issues is reduced. Furthermore, if a corner is present in the input shape, the point is determined to be a singular point, and the simulation result is likely to be greatly changed. However, since the shape generating section 210 connects the line segments into the smooth curve shape without the corners, these issues are reduced.

In the embodiments, the image processing section 2 is a portion of the process simulation apparatus 1, but is not limited thereto, and may execute the image processing method described above as an independent image processing apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing method comprising:
   detecting edge information from an input image;
   identifying a plurality of lines from the edge information;
   dividing the input image into a plurality of areas based on relative locations of the plurality of identified lines;
   calculating a similarity between adjacent areas of the plurality of divided areas;
   detecting boundaries between adjacent areas as line segments partitioning the adjacent areas based on a degree of dissimilarity of the adjacent areas, wherein each of the line segments is at least a portion of the plurality of lines; and
   connecting the line segments forming the boundaries and generating a connected shape using the boundaries.

2. The method of claim 1, wherein the step of detecting boundaries includes determining the degree of dissimilarity of the adjacent areas.

3. The method according to claim 1, further comprising:
   comparing gray scales of the adjacent areas when calculating their degree of similarity.

4. The method according to claim 3, further comprising:
   comparing frequency distributions of gradation values of the adjacent areas when calculating their degree of similarity.

5. The method according to claim 1, further comprising:
   detecting a boundary as a line segment between the areas having different physical properties when the degree of similarity between the adjacent areas is lower than a predetermined value.

6. The method according to claim 1, further comprising:
   connecting the line segments into a smooth curve shape without corners at connections of the line segments which are detected as the boundaries to generate the connected shape.

7. The method according to claim 1, further comprising:
   identifying a plurality of lines from the edge information using a Hough transform.

8. The method of claim 1, further comprising:
   providing the input image as an image of a physical structure obtained by at least one of a scanning electron microscope (SEM), a transmission electron microscope (TEM) or a scanning transmission electron microscope (STEM).

9. A process simulation apparatus comprising:
   an edge detecting section configured to detect edge information from an image;
   a line identifying section configured to identify a plurality of lines from the edge information of the image;
   an area dividing section configured to divide the image into a plurality of areas based on the plurality of identified lines;
   a similarity calculating section configured to calculate similarities between adjacent areas of the plurality of divided areas;
   a boundary detecting section configured to detect line segments between the adjacent areas, the line segments comprising portions of the plurality of lines which are boundaries between areas having different properties, based on a degree of dissimilarity between the adjacent areas; and
   a shape generating section that connects the line segments which are detected as the boundaries, and generates a connected shape using the boundaries.

10. The apparatus of claim 9, wherein the boundary detecting section is configured to detect a line segment when the degree of dissimilarity between the adjacent areas is less than a similarity threshold.

11. The apparatus of claim 9, wherein the different property is a physical property.

12. The apparatus of claim 9, wherein the different property is a material property.

13. The apparatus of claim 9, wherein the image is an image of a physical structure obtained by at least one of a scanning electron microscope (SEM), a transmission electron microscope (TEM) or a scanning transmission electron microscope (STEM).

14. A method of processing an image, comprising:
   providing an input image of a structure having one or more boundaries between portions thereof;
   finding edges within the image;
   identifying a plurality of lines from the edges;
   transposing the lines over the input image to divide the input image into a plurality of areas bounded by the lines;
   calculating a degree of similarity between adjacent areas of the plurality of divided areas;
   detecting boundaries between adjacent areas based on the degree of similarity of the adjacent areas; and
   connecting the detected boundaries between dissimilar adjacent areas and generating a connected shape using the boundaries.

15. The method of claim 14, further comprising generating curved line segments between the connected boundaries.

16. The method of claim 14, further comprising:
   providing the input image as an image of a physical structure obtained by at least one of a scanning electron microscope (SEM), a transmission electron microscope (TEM) or a scanning transmission electron microscope (STEM).

17. The method of claim 16, wherein the boundaries are detected as segments of the lines.

18. The method of claim 16, wherein the edges are found using a Hough transform.

* * * * *